US006774012B1

(12) United States Patent
Narayanan

(10) Patent No.: US 6,774,012 B1
(45) Date of Patent: Aug. 10, 2004

(54) FURNACE SYSTEM AND METHOD FOR SELECTIVELY OXIDIZING A SIDEWALL SURFACE OF A GATE CONDUCTOR BY OXIDIZING A SILICON SIDEWALL IN LIEU OF A REFRACTORY METAL SIDEWALL

(75) Inventor: Sundar Narayanan, Santa Clara, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/290,841

(22) Filed: Nov. 8, 2002

(51) Int. Cl.[7] .................. H01L 21/322; H01L 21/22; H01L 21/38; B05C 11/02; B05C 13/00
(52) U.S. Cl. .................. 438/471; 438/567; 118/52
(58) Field of Search .................. 438/585, 471, 438/692, 655, 567, 426, 240; 118/52, 723, 724

(56) References Cited

U.S. PATENT DOCUMENTS

| | | | | |
|---|---|---|---|---|
| 4,415,385 A | * | 11/1983 | Saito et al. ............... | 438/567 |
| 4,580,503 A | * | 4/1986 | Astrom .................... | 110/216 |
| 4,833,099 A | | 5/1989 | Woo | |
| 5,492,734 A | * | 2/1996 | Matsumoto et al. ... | 204/298.25 |
| 5,496,859 A | * | 3/1996 | Fong et al. ............. | 518/703 |
| 5,516,283 A | * | 5/1996 | Schrems .................. | 432/241 |
| 5,679,585 A | * | 10/1997 | Gardner et al. .......... | 438/655 |
| 5,753,303 A | * | 5/1998 | Cote et al. .............. | 427/248.1 |
| 5,796,151 A | | 8/1998 | Hsu et al. | |
| 5,962,763 A | * | 10/1999 | Cossee et al. ........... | 585/818 |
| 6,037,197 A | | 3/2000 | Yamazaki et al. | |
| 6,037,238 A | * | 3/2000 | Chang et al. ........... | 438/426 |
| 6,228,752 B1 | | 5/2001 | Miyano | |
| 6,247,245 B1 | * | 6/2001 | Ishii ....................... | 414/938 |
| 6,271,077 B1 | * | 8/2001 | Nakabayashi et al. ... | 438/240 |
| 6,325,017 B1 | * | 12/2001 | DeBoer et al. ......... | 118/723 R |
| 6,410,428 B1 | | 6/2002 | Chiang et al. | |
| 6,413,871 B2 | * | 7/2002 | M'Saad et al. .......... | 438/692 |
| 6,417,551 B2 | | 7/2002 | Miyano | |
| 6,435,868 B2 | * | 8/2002 | White et al. ............. | 118/724 |
| 6,485,203 B2 | * | 11/2002 | Katano et al. ........... | 118/52 |
| 6,515,843 B2 | * | 2/2003 | Nakabayashi et al. ... | 257/306 |
| 6,573,159 B1 | * | 6/2003 | Kobayashi et al. ...... | 438/471 |
| 6,585,430 B2 | * | 7/2003 | Matsuyama et al. ..... | 118/52 |
| 6,592,678 B1 | * | 7/2003 | Kamikawa et al. ...... | 134/18 |

* cited by examiner

*Primary Examiner*—John F. Niebling
*Assistant Examiner*—Walter L. Lindsay, Jr.
(74) *Attorney, Agent, or Firm*—Kevin L. Daffer; Mollie E. Lettang; Conley Rose P.C.

(57) ABSTRACT

An improved furnace system and method is provided to substantially minimize, if not eliminate, ambient air from entering a heated chamber of the furnace system during a critical processing step. The furnace system can be used in, for example, an oxidation step where ambient air containing oxygen is prevented from entering an atmospheric pressure tube by essentially purging potential leak areas with an inert gas, such as nitrogen, at the critical moment during temperature ramp up and ramp down, and prior to temperature stabilization and the introduction of an oxidizing gas. If oxygen is not present within the tube, then a tungsten sidewall surface of a gate conductor, for example, will not inadvertently oxidize at the critical pre- and post-oxidation moments. However, if steam is present where hydrogen is available with oxygen, the underlying polysilicon sidewall surface will selectively oxidize instead of the overlying tungsten. The inert gas-filled containers are retrofitted to potential leak areas of not only the tube, but also a torch that is used to forward heated gas into the tube.

21 Claims, 3 Drawing Sheets

FURNACE SYSTEM AND METHOD FOR SELECTIVELY OXIDIZING A SIDEWALL SURFACE OF A GATE CONDUCTOR BY OXIDIZING A SILICON SIDEWALL IN LIEU OF A REFRACTORY METAL SIDEWALL

BACKGROUND OF THE INVENTION

1. Field of the Invention

This invention relates to the manufacture of integrated circuits and, more particularly, to selective oxidation of a gate conductor having a layer of refractory metal and a layer of polycrystalline silicon ("polysilicon"). Selective oxidation is achieved by using an improved atmospheric pressure furnace that minimizes oxidation of the refractory metal sidewall yet allows oxidation of the polysilicon sidewall by flowing nitrogen at critical areas of the furnace to minimize oxygen leakage into the furnace while the furnace is closed and an oxide reducing gas, such as hydrogen, is not present.

2. Description of the Related Art

The following descriptions and examples are not admitted to be prior art by virtue of their inclusion within this section.

The manufacture of an integrated circuit involves many steps. For example, a gate conductor is formed by selectively removing polysilicon that had been previously blanket deposited across a semiconductor topography. The remaining polysilicon can thereafter be used as a mask when forming the junction regions into the underlying substrate. A polysilicon gate is therefore aligned between the underlying junction, and is sometimes referred to as a "self-aligned gate."

Many modern gate structures often involve multiple layers besides simply a polysilicon layer dielectrically spaced above a channel region. For example, the gate conductor can have a refractory metal layer aligned above the patterned polysilicon. The refractory metal can serve as a low resistive strap that essentially shorts the junction between the p-type and n-type polysilicon. Instead of placing the refractory metal only in the strap areas applicable to a complimentary metal-oxide-semiconductor (CMOS) device, the refractory metal can extend along the entire polysilicon trace, if needed, to help reduce the effective sheet resistance of the polysilicon gate and improve adhesion of the polysilicon to an overlying metal trace conductor that might extend across a majority of the integrated circuit.

A problem attributed to a stacked polysilicon and refractory metal gate conductor is that each layer will react differently when exposed to an oxidation step. For example, it may be necessary to oxidize the sidewall surface of the gate conductor in order to form a graded junction, using the well-known lightly-doped drain (LDD) technique. The oxidation step not only forms spacers on the sidewall surfaces of the gate conductor, but also helps heal any damage done to the polysilicon as a result of the previous etch step. The healing process is often accomplished by an anneal step. In order to anneal whatever damage might exist in the polysilicon, the gate conductor must be subjected to a relatively high temperature to convert the amorphous silicon into a more stable polysilicon composition.

Whenever the exposed sidewall surface of the polysilicon gate is subjected to oxygen at a high temperature, an oxide will grow on that polysilicon, possibly, in the form of a spacer. The same can be said of any overlying refractory metal sidewall surface that is also exposed to the oxidizing ambient. Depending on the refractory metal and the conditions in which the refractory metal is exposed to oxygen at a high temperature, the refractory metal may be entirely consumed or only partially consumed by the oxygen. In a worst-case scenario, the refractory metal might become entirely consumed and the structure of the refractory metal jeopardized so that any overlying capping layer of the gate conductor will dislodge from the gate conductor itself. In a less than worst-case scenario, the refractory metal is only partially consumed at the sidewall surface and the gate conductor presents a hillock, bump, or whisker that extends laterally outward from the gate conductor.

While it is beneficial to oxidize the sidewall surface of a gate conductor, it is far more important to only selectively oxidize that surface. In other words, it would be desirable to introduce a process that selectively oxidizes only the polysilicon sidewall surface, but not the refractory metal sidewall surface. An improvement is therefore needed in the oxidation process that would essentially minimize the introduction of oxygen during critical heating of the oxidation tube to effectuate the oxidation process. Many conventional methodologies teach the use of specially designed low pressure furnaces or tubes that carry out the oxidation process, or tubes that remain relatively cool until after wafers are pushed into the tube and thereafter the tube is heated to an oxidation temperature. While it is relatively known that refractory metal does not oxidize at lower temperatures, the concept of using low pressure furnaces that are relatively cool and then having to ramp up the temperature to achieve an oxidation temperature significantly lessens the throughput of the oxidation process. Therefore, selective oxidation of polysilicon and not refractory metal must be done in a way that whiskers do not form and throughput does not suffer.

SUMMARY OF THE INVENTION

The problems outlined above are in large part solved by an improved furnace and a process methodology that uses the improved furnace. The improved furnace is one that includes a tube that is preferably preheated to a relatively high temperature. Aligned with the tube is a plurality of wafers placed within a boat, and the wafer-containing boat is maintained in a load-lock area. The load-lock area or boat handing area contains essentially only an inert ambient, such as nitrogen gas. The boat is then inserted into the preheated tube, which is then sealed.

Even though the tube is sealed after it is loaded, there may be inadvertent leaks that form in or around the doorway into the tube, as well as in the inlet or exhaust lines to and from the tube. Placed around each of those potential leak areas is preferably a container. The container can be configured as a box, for example, having an opening that is secured preferably to an exterior surface of the tube around the potential leak area. The container also has an inlet through which an inert gas, such as nitrogen, can be introduced into the container. The inert gas then circulates into the container around the leak area and thereby prevents any ambient air, such as oxygen, from entering the tube during a critical temperature ramp up moment that must take place to carry out the subsequent oxidation.

While the boat handling area is purged of oxygen and the tube is preheated, any oxygen which enters through the inadvertent leak areas in the absence of an oxide reducing gas, such as hydrogen, will, unfortunately, oxidize the refractory metal. When oxidation is carried out, both hydrogen and oxygen should be present in the form of steam. In the critical moments before oxidation, either the inert gas, hydrogen, or a combination of inert gas and hydrogen, are present—not oxygen. Preferably, the inert gas and hydrogen is maintained during temperature ramp up and ramp down, with more inert gas being present than hydrogen. The inert gas and hydrogen is hereinafter referred to as a "forming gas." After temperature ramp up and before ramp down, the inert gas is replaced with more hydrogen and oxygen, to form steam. The steam is alternatively referred to as an "oxidizing gas." The steam not only oxidizes the polysilicon sidewall surface, but also partially oxidizes the refractory metal sidewall surface. However, the hydrogen within the steam ambient will reduce whatever oxidation occurs on the refractory metal sidewall surface so that essentially little if any oxidation growth occurs on the refractory metal sidewall.

Instead of using a relatively cool tube that may be of the low-pressure variety, the present tube is preheated to enhance throughput and is purposely an atmospheric pressure tube or furnace. An atmospheric pressure oxidation furnace utilizes a torch to preheat the forming gas introduced into the tube. The forming gas is placed into the tube at atmospheric pressure, with any hydrogen present in the tube occurring after the tube is sealed to prevent a combustible condition.

According to one embodiment, an atmospheric pressure furnace is provided. The furnace includes a tube and a container. The container can be secured against the external surface of the tube so that a portion of the container forms an opening which abuts with the external surface and surrounds an opening, crack, aperture, or leak into the tube. Thus, the opening is alternatively referred to as a leak area. The container essentially covers the leak area and confines an inert gas received by the container to the leak area: This essentially prevents large amounts of ambient air containing oxygen from entering the leak area (relative to oxygen entering the leak area absent the nitrogen-filled containers) during a critical pre- or post-oxidation moment.

The opening or leak is one that is purposely not present by design. However, the opening or leak into the tube might occur if a seal or hinge, for example, on the inlet line, outlet line, or tube door were to leak. In addition to the container being usable to cover leaks within the tube, the container can also be used to cover leaks within a heating chamber or torch external to and separate from the tube. That is, in an atmospheric pressure furnace, a torch is needed to preheat gas introduced into the tube. Like the tube, the heating chamber can also develop inadvertent leaks. The container either completely or partially surrounds the entire heating chamber.

According to another embodiment, an apparatus is provided. The apparatus comprises the container having an inlet and an opening. The inlet serves to receive an inert gas into the container and the opening can be placed against an external region of a vessel, such as the tube or heating chamber (torch). The opening of the container is therefore one that can be configured to secure around a leak area of the vessel.

According to yet another embodiment, a method is provide& The method includes pushing wafers through a doorway into a heated tube and then closing the doorway. The temperature of the tube can then be increased in the presence of a forming gas, such gas being a majority (much greater than 60%) nitrogen and a minority (much less than 40%) hydrogen. Thereafter, the nitrogen can be removed and hydrogen flow increased, along with oxygen, to form steam while inert gas is maintained across select portions of the exterior surface of the tube that may or may not contain a leak. Preferably, however, the inert gas is thereby present should a leak form.

BRIEF DESCRIPTION OF THE DRAWINGS

Other objects and advantages of the invention will become apparent upon reading the following detailed description and upon reference to the accompanying drawings in which.

DETAILED DESCRIPTION OF PREFERRED EMBODIMENTS

Figure 1:
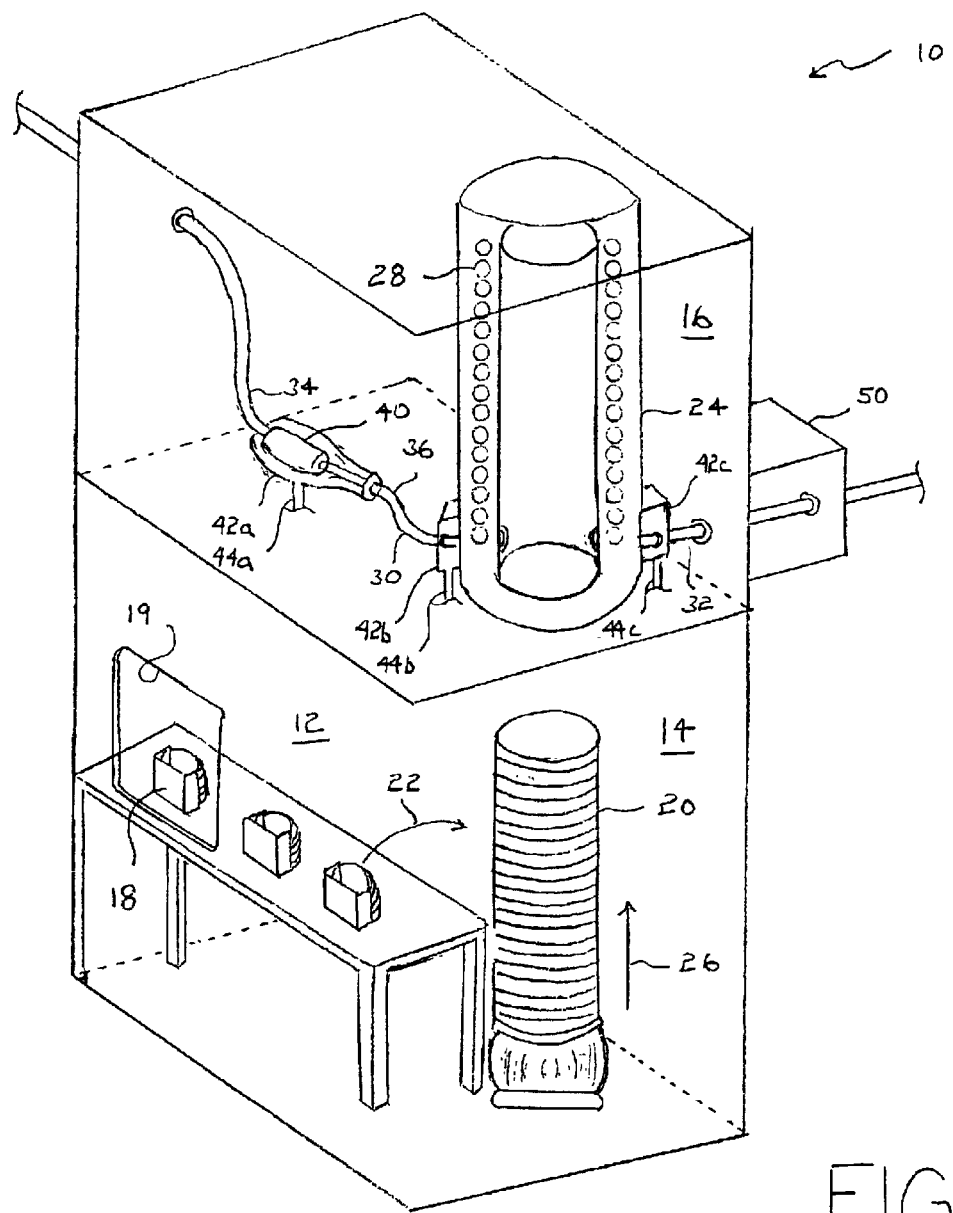
FIG. 1 is a perspective, partial cutaway view of a production furnace comprising a cassette storage area, a boat handling area and a heating tube.

Turning now to the drawings, FIG. 1 illustrates a furnace 10 which can be utilized in the manufacture of an integrated circuit. Furnace 10 can include three components: a cassette staging area 12, a boat handling unit 14, and a tube 16. Cassette staging area 12 allows for wafer-filled cassettes 18 to be inserted through a doorway 19 from the wafer fabrication area to the wafer staging area 12. Doorway 19 can then be sealed after the proper number of wafer-filled cassettes are inserted into furnace 10.

Once sealed, the cassette storage area 12 and the boat handling unit 14 are filled with an inert gas, such as nitrogen. Although not shown, area 12 is preferably sealed from the area of the boat handling unit 14, except during times when a doorway is opened and a robotic arm transfers the wafer cassettes 18 from area 12 to the boat handling unit 14. All other non-inert gases are purged from regions 12 and 14 to hopefully prevent any oxidation of the wafers when regions 12 and 14 are subsequently exposed to the heated tube within region 16. A robotic arm can be used to retrieve wafers from cassette 18 to be placed into a boat 20. Arrow 22 indicates the movement of the robotic arm (not shown).

Once the staged wafers in area 12 are placed into boat 20 of area 14, the boat is then ready for insertion into tube 24. However, before the wafer-filled boat 20 can be inserted, a doorway into region 16 must be opened. Boat 20 can then be extended upward along arrow 26 into the opening of tube 24. Preferably, tube 24 is preheated via heater elements 28 which surround the quartz tube inner lining. Also, preferably, the ambient within tube 24 is an inert ambient similar to the inert ambient within regions 12 and 14. This will prevent inadvertent oxidation growth until such time as an optimal forming gas is presented to the tube. If the inert ambient were not present, then oxide would grow since the wafers would be exposed to an oxidizing, high temperature.

Region 16 need not be an inert gas-filled region as are regions 12 and 14. Instead, region 16 can consist of the ambient air within the fabrication facility. Therefore, the ambient air exists around the external surface of tube 24 and, particularly, around the inlet tube 30 and the outlet tube 32. Likewise, the ambient air can also exist around the doorway after the doorway is closed. Still further, ambient air may exist around the heating chamber, or torch 40, as well as the inlet line 34 and outlet line 36 that go into and out of torch 40. Torch 40 is independent and separate from tube 24 and serves to preheat gas before inserting the gas into the heated tube. If the gas is not heated and cool supply gas is fed into a heated quartz tube, the quartz might crack or shatter. Thus, torch 40 is beneficial in the oxidation step where the tube must be heated to a relatively high temperature.

Torch 40, similar to the inlet and outlet lines and doorway of tube 24, is preferably surrounded (partially or completely) by a container 42a, similar to containers 42b and 42c which partially or completely surround areas of tube 24. The purpose of containers 42 are to surround potential leak areas either within torch 40 or tube 24. The leak areas are ones which would normally not exist, except that possibly over time seals around the inlet lines, outlet lines and the sealed doorway might fail, thereby allowing outside (non-inert) ambient air to come into torch 40 or tube 24. Each container 42 not only surrounds the potential leak areas, but also has an inlet 44a, 44b, and 44c, as shown. The inlet allows inert gas, such as nitrogen, to be forwarded into the respective container 42 so that the leak area is subjected to inert gas rather than ambient air.

Tube 24 can be configured in numerous ways with dissimilar orientations. The example shown in FIG. 4 indicates tube 24 being a vertical tube, where boat 20 is inserted vertically upward into the opening of tube 24. However, just as likely, tube 24 can be arranged horizontally, with individual wafers or wafer-filled cassettes suspended along the horizontal axis of the tube using various cantilevers and soft-landing systems, for example. Both tube 24 and torch 40 can have one or more inlet lines and one or more outlet lines.

An atmospheric pressure tube receives heated gas produced from a torch 40. If tube 24 is a low pressure tube, then most low pressure oxidation systems involve a bubbler, where steam is drawn from a heated container partially filled with water. The lower pressure of the tube will draw the steam into the tube. Conversely, an atmospheric pressure tube cannot draw steam similar to a low pressure tube. Instead, an atmospheric pressure tube involves a torch that mixes heated hydrogen and oxygen to form steam that is forced into the tube by the torch. If a torch is used with a low pressure tube, the lower pressure of the tube will, in effect, extinguish the flame of the torch due to the pressure differential between the torch and the lower pressure tube. Thus, low pressure furnaces generally involve a bubbler while atmospheric pressure furnaces generally involve a torch. Also associated with an atmospheric pressure tube that uses volatile gases, such as hydrogen, is a burnbox and/or scrubber 50. Scrubber 50 ensures that hydrogen, when heated, does not cause a combustible situation within the fabrication facility. The burnbox thereby burns off the hydrogen as it is being expelled from the outlet line 32.

Figure 2:
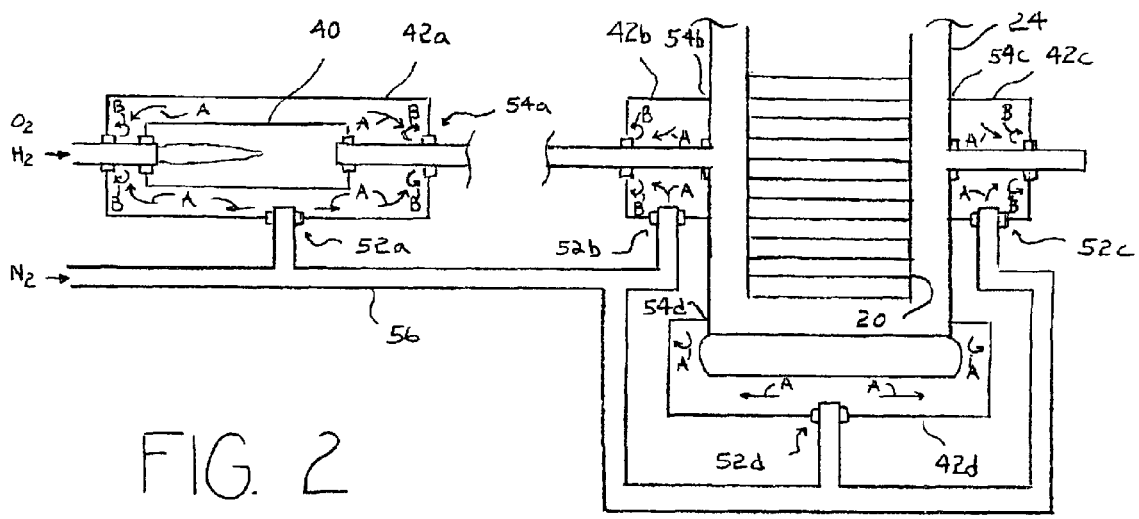
FIG. 2 is a side elevation view of the tube coupled to receive heated forming gas sent from a torch, wherein both the tube and the torch have leak areas proximate the inlet lines, exhaust lines and the door of the tube surrounded with respective containers that receive a flow of inert gas across the leak areas.

FIG. 2 illustrates in more detail containers 42a, 42b, 42c and 42d placed around potential leak areas of torch 40 and tube 24. Each container 42a, 42b, 42c and 42d includes a corresponding inlet 52a, 52b, 52c and 52d, and an opening 54a, 54b, 54c and 54d. The inlet is configured to receive a conduit 56. Conduit 56 preferably contains an inert gas, such as nitrogen. Opening 54 is dimensioned to abut against or secure around various external surfaces of torch 40, tube 24, or the numerous inlet and outlet lines that extend into or from torch 40 or tube 24. The openings are arranged so that they substantially seal around the leak area or potential leak area and, more specifically, container 42 which envelopes the opening thereby surrounds the leak area. In this fashion, if a leak were to exist, the inert gas introduced into the inlet 52 (as shown by arrows A) will force any ambient air (shown by arrows B) from entering into the leak area. Accordingly, even if the opening 54 were not completely sealed against the external surface of tube 24, torch 40, or the lines associated therewith, ambient air which might leak into container 42 via opening 54 would be substantially turned away from the leak area by virtue of the inert gas forwarded into the container.

While the prevalent leak areas are identified as the areas around the doorway, the inlet/outlet lines of tube 24, and the inlet/outlet lines of torch 40, there may be other regions where a leak could potentially exist. Container 42 is envisioned as any container that can receive an inert gas and distribute the inert gas to any leak area of what should ideally be a sealed chamber, and not just the example areas identified above. Torch 40 and tube 24 can also be arranged in different configurations beyond the exemplary configuration shown, provided the ideally sealed torch 40 and tube 24 are usable in an oxidation environment, with oxygen and hydrogen being mixed and heated to form steam, as shown.

Figure 3:
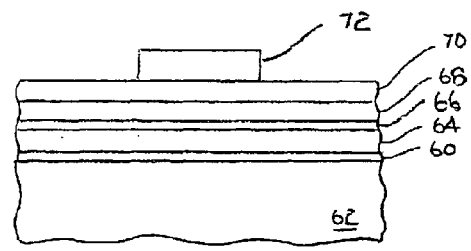
FIG. 3 is a partial cross-sectional view of a semiconductor topography comprising a patterned masking layer placed upon an upper layer of multiple layers.

FIG. 3 illustrates one example an oxidation process. It is important to note, however, that oxidation can be applied at numerous process steps within the overall integrated circuit manufacturing process. The single oxidation step drawn forth in the example of producing a sidewall oxide is simply one example where the improved furnace hereof might be used. FIG. 3 indicates a cross-section of a semiconductor topography having a blanket layer of oxide 60 formed on a semiconductor substrate 62. Formed above oxide 60 might be a layer of amorphous silicon 64. Above amorphous silicon 64 might be a barrier layer, such as a refractory metal nitride 66. A popular barrier layer might be tungsten nitride, for example. Above barrier layer 66 might be a refractory metal layer, such as tungsten 68. The multi-layers 60, 64, 66, and 68 might be thereafter capped by a nitride layer 70. The entire multi-layer structure can then be possibly subjected to photolithography using a patterned masking layer, such as hardened photoresist 72.

Figure 4:
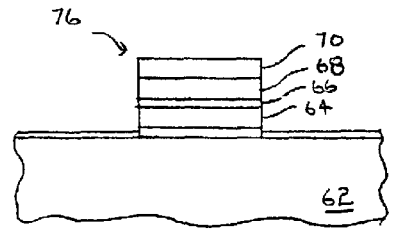
FIG. 4 is a partial cross-sectional view of the semiconductor topography of FIG. 3 after the multiple layers not covered by the patterned masking layer are removed to form a multi-layer gate conductor.

FIG. 4 illustrates a subsequent process step to that of FIG. 3, where the prior masking layer 72 will allow the exposed multiple layers 64–70 to be removed using various well-known anisotropic or isotropic etch and clean sequences. In addition to the overlying layers being removed, at least a portion of oxide layer 60 may also be removed. Thereafter, the patterned photoresist layer is removed leaving a multi-layer gate 76. Gate 76 includes layers 64–70 dielectrically spaced above a channel region that will then be formed within substrate 62.

Figure 5:
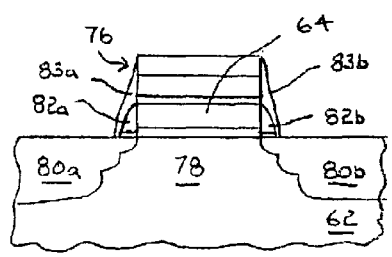
FIG. 5 is a partial cross-sectional view of the semiconductor topography of FIG. 4 after the sidewall surface of a polysilicon layer within the gate conductor is selectively oxidized in lieu of the sidewall surface of a refractory metal layer within the gate conductor, using the improved atmospheric pressure furnace of FIGS. 1 and 2.

FIG. 5 illustrates channel region 78 formed within substrate 62, between a graded pair of junctions 80a and 80b. The graded junctions are formed using the self-aligned gate masking technique coupled with spacer formation on the sidewall surfaces of the polysilicon layer 64. Spacers 82a and 82b grow outward from the opposing sidewall surfaces of polysilicon 64 but not the overlying refractory metal 68, using a selective oxidation process carried out within the improved furnace of FIGS. 1 and 2. That process is further defined in FIG. 6. In addition to spacer 82, spacer 83 extends outward from spacers 82 may be used to extend the graded junctions and to seal or "cap" the underlying sidewall surfaces from the interlevel dielectric, for example. The capping spacer 83 can be deposited, and can be made of silicon nitride.

Figure 6:
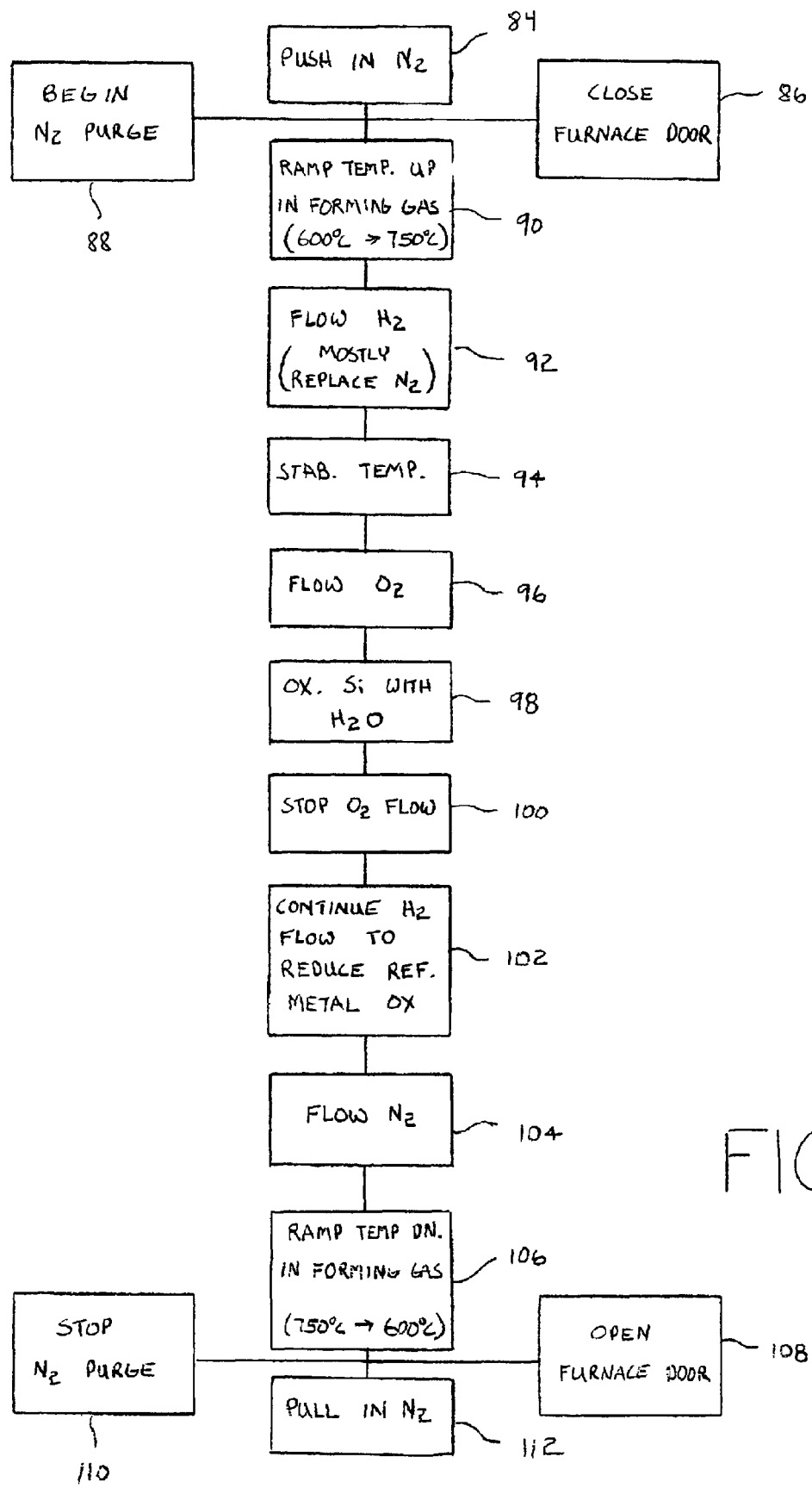
FIG. 6 is a flow diagram of the selective oxidation process undertaken by the improved atmospheric pressure furnace of FIGS. 1 and 2.

FIG. 6 illustrates a processing sequence used for selective oxidation of a polysilicon sidewall surface rather than, for example, an overlying refractory metal sidewall surface. The process of oxidizing the sidewall surface of polysilicon while annealing any damage caused by the previous etch step begins by opening the tube and pushing the wafer-filled boat into the tube from the boat handling area that contains solely a nitrogen ambient (FIG. 1). Thus, the push step 84 can occur within a nitrogen ambient since, as will be described below, the tube is prepared to initially contain nitrogen. Once the boat is placed into the tube, the tube or furnace door is closed 86 and either prior to closing the furnace or as the furnace door is closing, the containers around the leak areas also receive a nitrogen purge gas 88. As the tube is sealed and the leak areas remain purged of any ambient air with nitrogen, the temperature of the tube can be increased to an oxidation temperature from, for example, about 500–650° C. to approximately 700–850° C. and, more preferably, from about 600° C. to 750° C., as shown by step 90. Even though the containers receive nitrogen in and around the potential leak areas, it is possible that some oxygen might inadvertently leak from the outside ambient into the tube. The oxygen leak will, however, be two to three orders of magnitude less than if the nitrogen-purge containers were not used. In order to prevent refractory metal consumption and/or whisker formation during the ramp up procedure, hydrogen gas can be introduced into the tube along with the nitrogen gas once the door of the tube closes. The hydrogen gas mixes with the nitrogen gas and becomes a forming gas that is present throughout the ramp up step 90. Thus, the process involves a switch from pure nitrogen gas to a combination of nitrogen and hydrogen, preferably around 1–10% hydrogen, and more preferably 5% hydrogen relative to nitrogen. As the temperature has stabilized, hydrogen flow is increased and hydrogen then essentially replaces the nitrogen inside the tube, as shown by step 92.

It is important to note that prior to the entry of hydrogen, the tube contained almost exclusively nitrogen or any other inert-type ambient. In particular, prior to the introduction of hydrogen, the tube should not contain oxygen and, therefore, the container surrounding the leak areas must be purged with nitrogen as the tube is being purged, and throughout the time between when the tube was purged and the wafers are pushed into the tube and the doorway is thereafter sealed. If oxygen were somehow allowed to leak into the tube prior to the introduction of hydrogen, the oxygen would oxidize the sidewall surfaces of, for example, tungsten without the benefit of a reducing agent, such as hydrogen to eliminate such oxidation. Therefore, the critical moment during the oxidation step where nitrogen purge of the container is beneficial is the steps between when the tube is purged and when hydrogen is introduced into the sealed tube. To avoid any inadvertent oxygen leaks even though hydrogen-filled containers attempt to mitigate such leaks, a hydrogen reducing agent might be used along with the nitrogen purge gas. Hydrogen must be introduced into a sealed container since its explosive nature (when heated) would be detrimental outside a sealed environment.

As hydrogen is being introduced into the tube, the temperature of the tube is stabilized to an oxidation temperature 94 and, thereafter, oxygen is introduced into the tube via torch 40 at step 96. The high temperature $H_2O$ (steam) environment not only oxidizes the silicon, but the hydrogen component of steam substantially prevents oxidation of the refractory metal while, at the same time, the high temperature environment anneals any prior etch damage done to the polysilicon. Oxidation of the silicon with steam and conversion of the amorphous silicon to polysilicon is shown at step 98.

Once the proper spacer thickness is achieved, oxygen flow is terminated at step 100, yet hydrogen flow is continued to beneficially reduce any oxide which may have formed on the sidewall surface of the refractory metal 102. The duration of hydrogen flow can be adjusted depending on how much reduction is needed and, thereafter, nitrogen can be introduced within the tube at step 104 before or while the temperature is being ramped down 106. The ramp down step 106 occurs preferably within a hydrogen and nitrogen forming gas, where the hydrogen component will mitigate any oxygen leaks which might somehow still exists even though the hydrogen-filled containers are present. Once the temperature is sufficiently lowered in the tube, the furnace or tube door is opened 108 and the nitrogen purge of the containers is terminated at step 110. Thereafter, the wafers can be pulled from the tube in a nitrogen ambient 112.

It will be appreciated to those skilled in the art having the benefit of this disclosure that the present process steps and leak avoidance measures can be applicable to any high temperature furnace and not simply to an oxidation furnace, much less a vertical oxidation furnace. The primary objective of the present process steps and leak avoidance measures is to substantially minimize, if not entirely avoid, any ambient air which would be deleterious to the processing environment within the furnace during critical moments of furnace operation. The example described above is applicable to oxidation, where ambient air containing oxygen is to be avoided during times when a refractory metal sidewall surface is exposed to a high temperature in the absence of hydrogen. Thus, until hydrogen is introduced into the tube, oxygen should be eliminated from the tube by ensuring leak a are properly purged with nitrogen. Approximately 5–10 liters/minute flow of nitrogen into each container surrounding the leak area appear sufficient to prevent any ambient air containing oxygen from entering the tube or torch via the leak area. It is intended that the following claims be interpreted to embrace all such benefits, features, modification, and changes. Accordingly, the specification and drawings are to be regarded in an illustrative rather than a restrictive sense.

What is claimed is:

1. A method of selectively growing an oxide, comprising:
   pushing wafers through a doorway into a heated tube while flowing inert gas onto an external surface of the tube having a leak area or potential leak area;
   closing the doorway and increasing the temperature of the tube; and
   flowing heated hydrogen and oxygen into the tube to form steam.

2. The method as recited in claim 1, wherein said flowing heated hydrogen and oxygen comprises introducing hydrogen into the tube before introducing oxygen.

3. The method as recited in claim 1, wherein said flowing heated hydrogen and oxygen comprises heating hydrogen in a torch followed by heating oxygen in a torch before sending the heated hydrogen followed by sending the heated oxygen to the tube.

4. The method as recited in claim 1, wherein said increasing comprises ramping the temperature within the tube from approximately 500–650° C. to approximately 700–850° C. in the presence of hydrogen and nitrogen.

5. The method as recited in claim 1, wherein said flowing inert gas comprises introducing nitrogen into a container that is secured about an inlet gas line seal of the tube, an exhaust gas line seal of the tube, or a seal of a door secured to the doorway of the tube.

6. An atmospheric pressure furnace, comprising:

a tube; and a container placed proximate to an external surface of the tube and surrounding an opening into the tube for receiving an inert gas fed into the container and into the opening substantially in place of ambient air that would traverse the opening if the inert gas-filled container were not present.

7. The furnace as recited in claim 6, wherein the tube comprises an inlet line configured to forward a forming gas followed by an oxidizing gas into the tube, and wherein the opening extends between an external surface of the inlet line and the tube.

8. The furnace as recited in claim 7, wherein said forming gas comprises hydrogen and nitrogen, and wherein said oxidizing gas comprises steam.

9. The furnace as recited in claim 6, wherein the tube comprises an outlet line configured to forward an exhaust gas from the tube, and wherein the opening extends between an external surface of the outlet line and the tube.

10. The furnace as recited in claim 6, wherein the tube comprises a doorway configured to receive semiconductor wafers into the tube, and wherein the opening extends between the doorway and a door secured against the doorway.

11. The furnace as recited in claim 6, further comprising:

a heating chamber external to and separate from the tube; and a second container partially surrounding an external surface of the heating chamber and at least partially surrounding a second opening into the heating chamber for receiving the inert gas fed into the second container and into the second opening substantially in lieu of air.

12. The furnace as recited in claim 11, wherein the heating chamber comprises an inlet line configured to receive a forming gas followed by an oxidizing gas, and wherein the second opening extends between an external surface of the inlet line and the heating chamber.

13. The furnace as recited in claim 12, wherein the forming gas comprises hydrogen and nitrogen, and wherein said oxidizing gas comprises steam.

14. The furnace as recited in claim 11, wherein the heating chamber comprises an outlet line configured to receive a heated said forming gas and said oxidizing gas, and wherein the second opening extends between an external surface of the outlet line and the heating chamber.

15. The furnace as recited in claim 7, wherein the forming gas comprises approximately 1–10% hydrogen and 90–99% nitrogen.

16. The furnace as recited in claim 7, wherein the forming gas comprises approximately 5% hydrogen and 95% nitrogen.

17. The furnace as recited in claim 6, wherein the opening comprises an inadvertent opening or leak that but for the container would receive inappropriate ambient air into the tube.

18. An apparatus, comprising:

a container having an inlet and an opening;

wherein the inlet extends through a first portion of the container and the opening is formed through a second portion of the container such that the inlet is adapted to receive an inert gas and the opening is adapted to secure around a leak area or potential leak area of a vessel.

19. The apparatus as recited in claim 18, wherein the vessel is either a heating tube or a torch.

20. The apparatus as recited in claim 18, wherein the vessel is sealed but for the leak area, and the opening is adapted to secure to an outside surface of the vessel to cover the leak area.

21. The apparatus as recited in claim 18, wherein the leak area extends through the vessel or a seal adjacent the vessel.

* * * * *